United States Patent [19]

Sepponen

[11] Patent Number: 5,154,603
[45] Date of Patent: Oct. 13, 1992

[54] EXAMINATION METHOD AND APPARATUS

[75] Inventor: Raimo Sepponen, Helsinki, Finland

[73] Assignee: Instrumentarium Corp., Finland

[21] Appl. No.: 596,482

[22] Filed: Oct. 12, 1990

[30] Foreign Application Priority Data

Nov. 27, 1989 [FI] Finland ............................. 895649

[51] Int. Cl.⁵ .................................................. A61B 5/55
[52] U.S. Cl. .............................. 128/653.2; 128/653.3;
  324/306; 324/309; 324/316
[58] Field of Search ....... 128/653 A, 653 AF, 653 CA;
  324/306, 307, 309, 312, 316, 318

[56] References Cited

U.S. PATENT DOCUMENTS

| | | | |
|---|---|---|---|
| 4,602,641 | 7/1986 | Feinberg | 128/653 AF |
| 4,699,148 | 10/1987 | Gyngnell | 128/653 |
| 4,707,658 | 11/1987 | Frahm et al. | 324/309 |
| 4,719,425 | 1/1988 | Ettinger | 128/653 |
| 4,906,931 | 10/1988 | Sepponen | 324/309 |
| 4,947,837 | 8/1990 | Sano et al. | 324/306 |
| 4,984,573 | 1/1991 | Leunbach | 128/653 CA |
| 5,016,637 | 5/1991 | Koizumi et al. | 128/653 AF |
| 5,038,784 | 8/1991 | Dumoulin | 324/306 |

FOREIGN PATENT DOCUMENTS

| | | | |
|---|---|---|---|
| 0033704 | 8/1981 | European Pat. Off. | 324/309 |
| 0205136 | 12/1986 | European Pat. Off. | 128/653 AF |
| 3339192 | 7/1984 | Fed. Rep. of Germany . | |
| 80795 | 7/1990 | Finland . | |
| 8404398 | 11/1984 | PCT Int'l Appl. . | |
| 0898305 | 1/1982 | U.S.S.R. | 324/316 |
| 1363039 | 12/1987 | U.S.S.R. | 324/316 |
| 215308 | 8/1985 | United Kingdom | 324/309 |

OTHER PUBLICATIONS

Tanttu, J. "Koelaitteisto NMR-Kuvausta Varten", Helsinki Technical University, p. 69, 1982.
Lurie, D. J. et al., "Proton Electron Double Resonance Imaging: A New Method for Imaging Free Radicals", Proc. S.M.R.M., 1987.
Lurie, D. J. et al. "Proton-Electron Double Magnetic Resonance Imaging of Free Radical Solutions", J. Mag. Res., vol. 76, pp. 366-370, 1988.
Lurie, D. J. "Field Cycled Proton-Electron Double-Resonance Imaging of Free Radicals . . . ", J. Mag. Res. vol. 84, pp. 431-437, 1989.
Crooks, L. E., "Selective Irradiation Line Scan Techniques of NMR Imaging", IEEE Trans. Nucl. Sci., vol. 27, pp. 1239-1241, 1980.
Phohjonen, J., "Koelaitteisto Liikkuvan Kohteen NMR-Kuvausta Varten", Helsinki Tech. University, pp. 39-40, 1984.
Groen, J. P., et al. "MR Angiography Based on Inflow", Proc. Soc. Mag. Reson. in Med., vol. 2, p. 906, 1988.
Lepley, A. R., et al., "Chemically Induced Magnetic Polarization", Wiley, N.W., 1973, pp. 1-3, 36-43, 88-97, 134-139, 190-197, 220-227, 270-283, 320-327, 378-384.
Potenza, J., "Measurement and Applications of Dynamic Nuclear Polarization", Adv. Mol. Relaxation Processes, vol. 4, 1972, pp. 229-354.

*Primary Examiner*—Lee S. Cohen
*Assistant Examiner*—Krista M. Pfaffle
*Attorney, Agent, or Firm*—Andrus, Sceales, Starke & Sawall

[57] ABSTRACT

The invention relates to a method and apparatus for the examination of a moving component by the application of NMR methods and dynamic nuclear polarization (DNP). The saturation of electron spins required by DNP is adapted to occur within such area of an object in which the polarizing magnetic field has a different strength from the area of object which is subjected to NMR operations.

13 Claims, 3 Drawing Sheets

EXAMINATION METHOD AND APPARATUS

The present invention relates to a method and an apparatus based on magnetic resonance and particularly on dynamic nuclear polarization for the examination of e.g. a human body, foodstuffs or processed industrial products.

BACKGROUND OF THE INVENTION

Magnetic resonance imaging (MRI) is a method which utilizes the nuclear magnetic resonance phenomenon (NMR) for finding out the local distributions of the nuclear density and nucleus-related NMR properties of an object or the physical and chemical properties having an effect thereon. Said NMR properties include e.g.: longitudinal relaxation (characterized by longitudinal relaxation time T1), transverse relaxation (characterized by transverse relaxation time T2), relaxation in the rotating frame of reference (characterized by relaxation time T1rho), chemical shift, and coupling between nuclei. The physical phenomena having an effect on NMR properties include e.g.: flow rate, diffusion, paramagnetic materials, ferromagnetic materials, viscosity and temperature. Methods and applications of magnetic resonance and magnetic resonance imaging have been described in a number of references: Wehrli FW, Shaw D, Kneel and RJ: Biomedical Magnetic Resonance Imaging, VCH Publishers, Inc., New York 1988, Stark DD and Bradley WG: Magnetic resonance imaging, C. V. Mosby Comp., St. Louis 1988, Gadian DG: Nuclear magnetic resonance and its applications to living systems, Oxford Univ. Press, London 1982, Shaw D: Fourier transform NMR spectroscopy, Elsevier, Amsterdam, 1984, Battocletti JH: NMR proton imaging, CRC Crit. Rev. Biomed. Eng. vol. 11, pp 313-356, 1984, Mansfield P and Morris PG: NMR imaging in biomedicine, Adv. in magnetic resonance, Academic Press, New York 1982, Abragam A: The principles of nuclear magnetism, Clarendon Press, Oxford, 1961, Lasker SE and Milvy P(eds.): Electron spin resonance and nuclear magnetic resonance in biology and medicine and magnetic resonance in biological systems, Annals of New York Academy of Sciences vol. 222, New York Academy of Sciences, New York 1973, Sepponen RE: Discrimination and characterization of biological tissues with magnetic resonance imaging: A study on methods for T1, T2, T1rho and chemical shift imaging, Acta polytechnica scandinavica EL-56, Helsinki 1986, Fukushima E and Roeder SB: Experimental pulse NMR, Addison Wesley, London 1981, Thomas SR and Dixon RL (eds.) NMR in medicine: The instrumentation and clinical applications, Medical Physics Monograph No. 14, American Institute of Physics, New York 1986. Anderson W et al: U.S. Pat. No. 3,475,680, Ernst RR: U.S. Pat. No. 3,501,691, Tomlinson BL et al: U.S. Pat. No. 4,034,191, Ernst RR: U.S. Pat. No. 3,873,909, Ernst RR: U.S. Pat. No. 4,070,611, Bertrand RD et al: U.S. Pat. No. 4,345,207, Young IR: U.S. Pat. No. 4,563,647, Hofer DC et al: U.S. Pat. No. 4,110,681, Savelainen MK: Magnetic resonance imaging at 0.02 T: Design and evaluation of radio frequency coils with wave winding, Acta Polytechnica Scandinavica Ph 158, Helsinki 1988, Sepponen RE: U.S. Pat. No. 4,743,850, Sepponen RE: U.S. Pat. No. 4,654,595, Savelainen MK: U.S. Pat. No. 4,712,068, Sepponen RE: U.S. Pat. No. 4,587,493, Savelainen MK: U.S. Pat. No. 4,644,281 and Kupiainen J: U.S. Pat. No. 4,668,904.

Dynamic nuclear polarization has been described e.g. in the following references: Lepley AR and Closs GL: Chemically induced magnetic polarization, Wiley, New York, 1973, Potenza J: Measurement and Applications of dynamic nuclear polarization, Adv. Mol. Relaxation Processes vol. 4, Elsevier, Amsterdam 1972, pp. 229-354, Ettinger KV: U.S. Pat. No. 4,719,425.

DNP is a magnetic double resonance method which thus requires two separate spin populations. Such spin populations include e.g. The spins of electrons and protons. In a double resonance method, the distribution of one spin population on various energy levels is changed and the other spin population is under observation. When certain conditions are met, the resonance signal of a spin population being observed will increase. The amplified signal may have an amplitude which is several hundred times higher than the non-amplified signal. The amplification factor can be positive or negative. In terms of its characteristics, the amplified signal is highly sensitive to the physico-chemical properties and reactions of a spin environment, so its application for the examination of chemical properties of a material is obvious. The reference Ettinger KV: U.S. Pat. No. 4,719,425 discloses as applications the mapping of concentrations of paramagnetic components and the mapping of the activity of cerebral nerve cells. The references Lurie DJ, Bussel DM, Bell LH, Mallard JR: Proton Electron Double Resonance Imaging: A new method for imaging free radicals, Proc. S.M.R.M. Fifth Annual Meeting, 1987, New York, p. 24 and Lurie DJ, Bussel DM, Bell LH, Mallard JR: Proton-Electron Double Magnetic Resonance Imaging of free radical solutions, J. Magn. Reson., vol. 76, 1988, pp. 366-370 disclose as possible applications the mappings of free radical groups, nitroxide radicals and degree of oxidation.

According to the prior art and referring to FIG. 1, an object P to be examined is placed in a magnetic field $B_o + B_o$ homogeneous as possible (so-called polarizing magnetic field), provided by magnet H and magnetic cell system M1 the apparatus further comprising a signal coil L for detecting an NMR signal connected to an NMR spectrometer including a computer a resonator array R for irradiating the object with a magnetic field having a frequency of electron spin resonance (ESR), said array R being provided with an oscillator and power amplifier unit S, the apparatus including a gradient coil assembly 6 for encoding positional information, the power required thereby being produced by gradient current sources GC controlled by the spectrometer.

In the prior known technology the electron spin system is saturated by irradiating an object at a frequency which matches the ESR frequency in field $B_o$ and by detecting an NMR signal at a frequency which matches the field strength $B_o$. Thus, for example, the strength 0.04T of $B_o$ used in the above-cited references is matched by the ESR frequency of 1.12 GHz and the NMR frequency of 1.7 MHz.

It is also prior known to effect the saturation of an electron spin system in a different field from the observation of a nuclear magnetic resonance signal. When the diameter of an object is great relative to the wavelength of radiation, which is the case e.g. in the examination of a human body, the alteration of a field brings about considerable safety and technical benefits. Such solution and its benefits are described in references Sepponen RE: FI Pat Appln 883153 and Lurie DJ, Hutchison JMS, Bell LH, Nichclson I, Bussel DM, Mallard JR: Field-Cycled Proton-Electron Double Resonance Imaging of Free Radicals in Large Aqueous Samples, J. Magn. Reson., vol. 84, pp. 431-437, 1989.

A drawback in the prior art is e.g. that, when an object to be examined is relatively large and electrically conductive, the saturation of an electron spin system must be performed at a relatively low frequency and the strength of a polarizing magnetic field must be set relatively low. Thus, the intensity of an NMR signal remains weak unless the strength of a polarizing field is increased for the duration of signal recording. A quick change of the field strength adds to the complexity of the apparatus. It is also difficult to carry out imaging operations with such imaging sequences in which the excitation pulses have a short repetition interval. This type of imaging sequences have been described e.g. in references Frahm J, Haase A, Matthaei D, Haenicke W, Merboldt K-D: U.S. Pat. No. 4,707,658 and Gyngnell ML: U.S. Pat. No. 4,699,148, prior to that in references Tanttu J: Koelaitteisto NMR-kuvausta varten (Test apparatus for NMR imaging), Graduation Thesis, Helsinki Technical University, Department of technical Physics, 1982, p. 69 and Pohjonen J: Koelaitteisto liikuvan kohteen NMR-kuvausta varten (Test apparatus for the NMR imaging of a moving object), Licenciate Thesis, Helsinki Technical University, Department of Technical Physics, 1984, pp. 39-40. Furthermore, it is difficult to perform so-called multiple slice imaging whose principle is disclosed e.g. in reference Crooks LE: Selective irradiation line scan techniques of NMR imaging, IEEE Trans. Nucl. Sci., vol. 27, pp. 1239-1241, 1980.

By means of the invention set forth in the claims it is possible to eliminate the drawbacks of the prior art and to enable the use of multiple slice and short repetition interval imaging sequences in certain applications.

DESCRIPTION OF THE DRAWINGS

The invention is illustrated in the accompanying drawings, in which.

DESCRIPTION OF THE ILLUSTRATED EMBODIMENT

Figure 1:
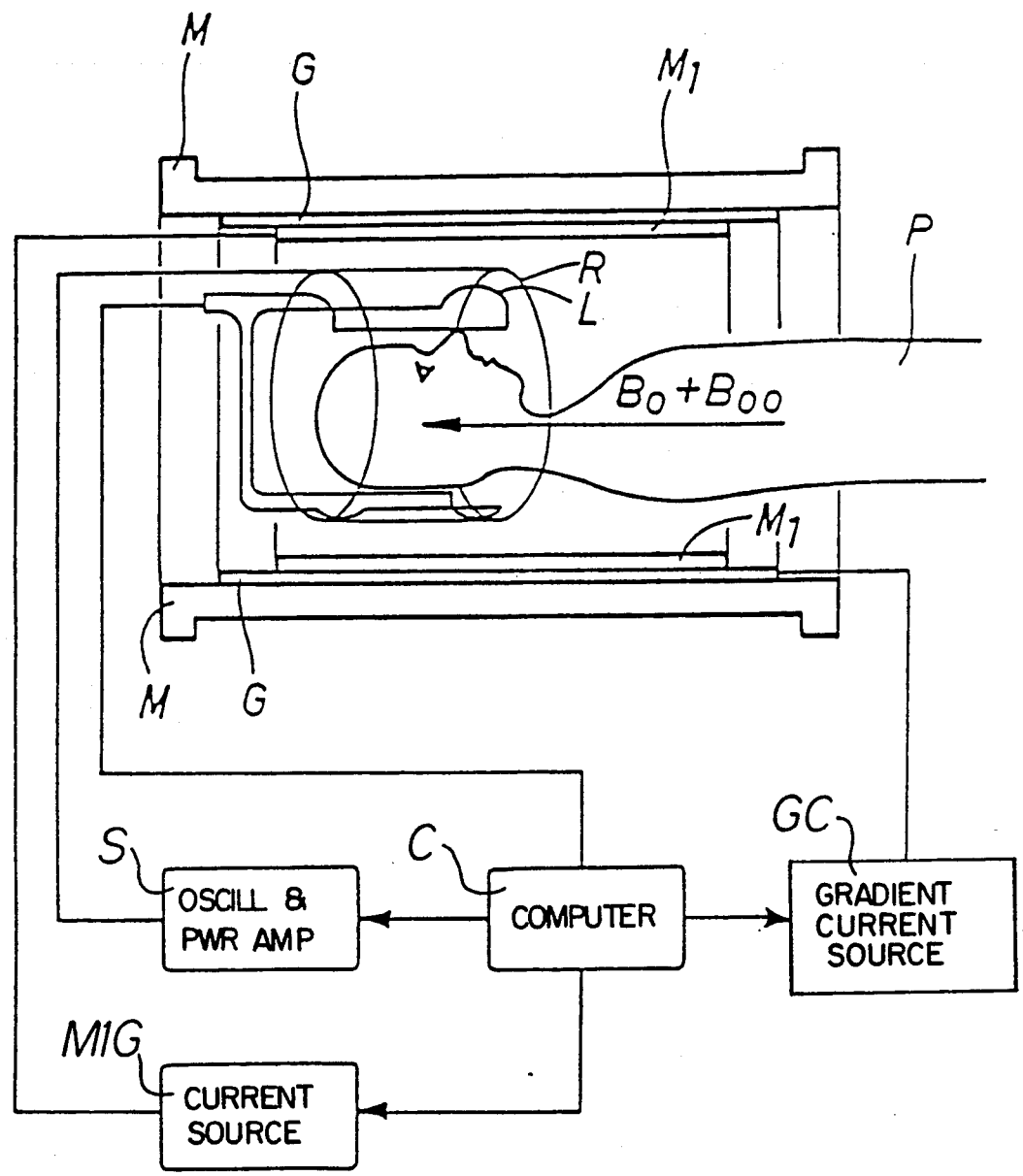
FIG. 1 shows a per se known embodiment of an imaging apparatus based on the magnetic resonance phenomenon, wherein the strength of a polarizing magnetic field is altered.

In the prior known examination methods utilizing the DNP phenomenon (Overhauser-effect), the saturating radio-frequency energy is applied to a region being examined. In some applications, however, the properties to be examined in a given object are associated with ingredients passing through a region being examined. This is the case e.g. when examining blood stream in the brain and in the limbs: Each heartbeat results in the transfer of blood from the left-hand cardiac ventricle into the arteries to fill the latter. The blood stream encounters its strongest resistance when passing through so-called small arteries. In order to clarify cerebral tissue perfusion and possible surgical strategies, the location of cerebral arteries should be found out as accurately as possible. The method of the invention makes it possible to utilize e.g. magnetic resonance imaging techniques for the imaging of cerebral arteries and for clarifying cerebral tissue perfusion. In a method of the invention, a component or ingredient to be examined is exposed to a polarizing magnetic field Bo1 within a so-called preparation area prior to its arrival in a region subject to examination, a polarizing magnetic field Bo2 being coupled across said region.

According to the DNP methods, e.g. an electron spin system is saturated within the preparation area with radio-frequency energy. The procedures required by magnetic resonance imaging or some other NMR examination, generally NMR procedures, are carried out in the examination region. In several applications it is preferred to select Bo1<Bo2 as well as Bo1 parallel to Bo2.

As an example of the applications of the method, the following description deals with the examination of cerebral blood circulation. Prior to the examination, a suitable relaxant is injected into the blood stream of a patient for intensifying the coupling of electron and nuclear spin systems. Such compounds include e.g. as contrast media. A patient is placed in an examination apparatus of the invention in a manner that the area to be examined, in this case the head, lies in a higher magnetic field and the pulmonary area lies in a low magnetic field. Prior to its arrival in the brain the blood has travelled from the right-hand cardiac auricle over the pulmonary circulation and arrived from the lungs into the left-hand cardiac auricle and from there through the left-hand ventricle into the aorta and further to cerebral arteries. The flow rate in the latter is so high that during a single heartbeat the blood in cerebral arteries is almost completely changed. Passing through the pulmonary circulation requires several heartbeats. In the examination of cerebral circulation, a preferred choice for a preparation area is the thorax as the penetration thereof requires a sufficiently long time to generate a powerful nuclear magnetization. On the other hand, upon leaving the preparation area the blood quickly reaches the examination area and, thus, the nuclear magnetization has no time to disappear. The relaxation time T1 of blood in a field of o.1 T is 600 ... 800 ms. After this period there is approximately 30% of magnetization left. Supposing that B01 is 150 G and DNP is used to achieve the increase of magnetization by a factor 100, the amount of magnetization after 1 s corresponds to an equilibrium magnetization of 0.5 T. Since blood stream in the arteries is continuous, the saturation induced by repeated excitations is lesser which further improves the signal-to-noise ratio. This phenomenon also facilitates the reconstruction of a circulatory system from thin slices recorded with selective excitation, the blood contained and flowing in a slice saturates less as it is changed and the circulatory system can be reconstructed by means of parallel slice images. The application of this method to conventional magnetic resonance imaging is described e.g. in the reference Groen JP, de Graaf RG, van Dijk P: MR angiography based on inflow, Proc. Soc. Magn. Reson. in Med, vol. 2, p. 906, Aug. 20-26, 1988, San Francisco, CA., U.S.A. Applying the prior known relaxation time measuring techniques it is possible to measure e.g. The relaxation times of blood.

Figure 2:
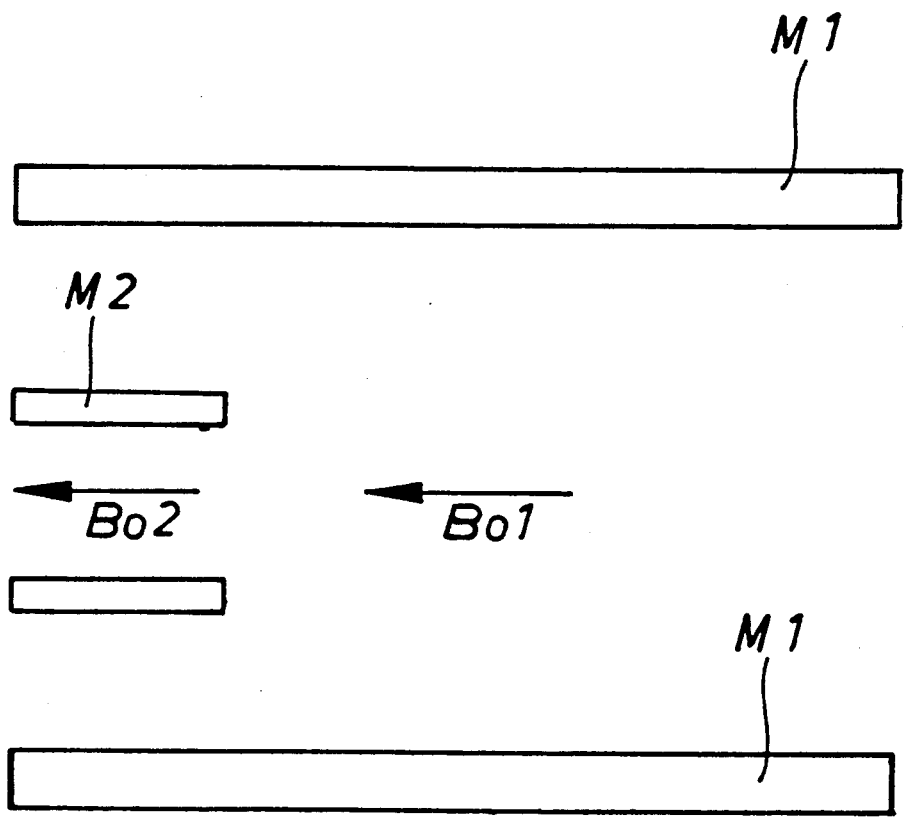
FIG. 2 illustrates the operating principle for an imaging apparatus of the invention.

FIG. 1 illustrates one basic embodiment of an imaging apparatus based on magnetic resonance, wherein the strength of a polarizing magnetic field is altered. Operation of the apparatus is controlled by a computer C which controls the excitation and signal-collection procedures, the operation of oscillator and power amplifier unit S as well as coil means R and L as well as gradient actions, such as a gradient current source GC for supplying current to a coil 6. A magnet M produces a polarizing magnetic field component Bo and magnetic coil system M1 a polarizing magnetic field component Boo. Magnetic coil system M1 is energized by current source MlG. Referring to FIG. 2, the method of the invention proceeds as follows. An object is in the apparatus in such a manner that the portion of the object from which a component to be examined travels is positioned in a polar magnetic field Bo1 and the area to which the component travels be examined in a polarizing magnetic field Bo2. A dynamic nuclear polarization phenomenon is produced within an are which is coupled a polarizing magnetic field Bo1 and the actions required by magnetic resonance occurs within an area across which is coupled a polarizing magnetic field Bo2.

Figure 3:
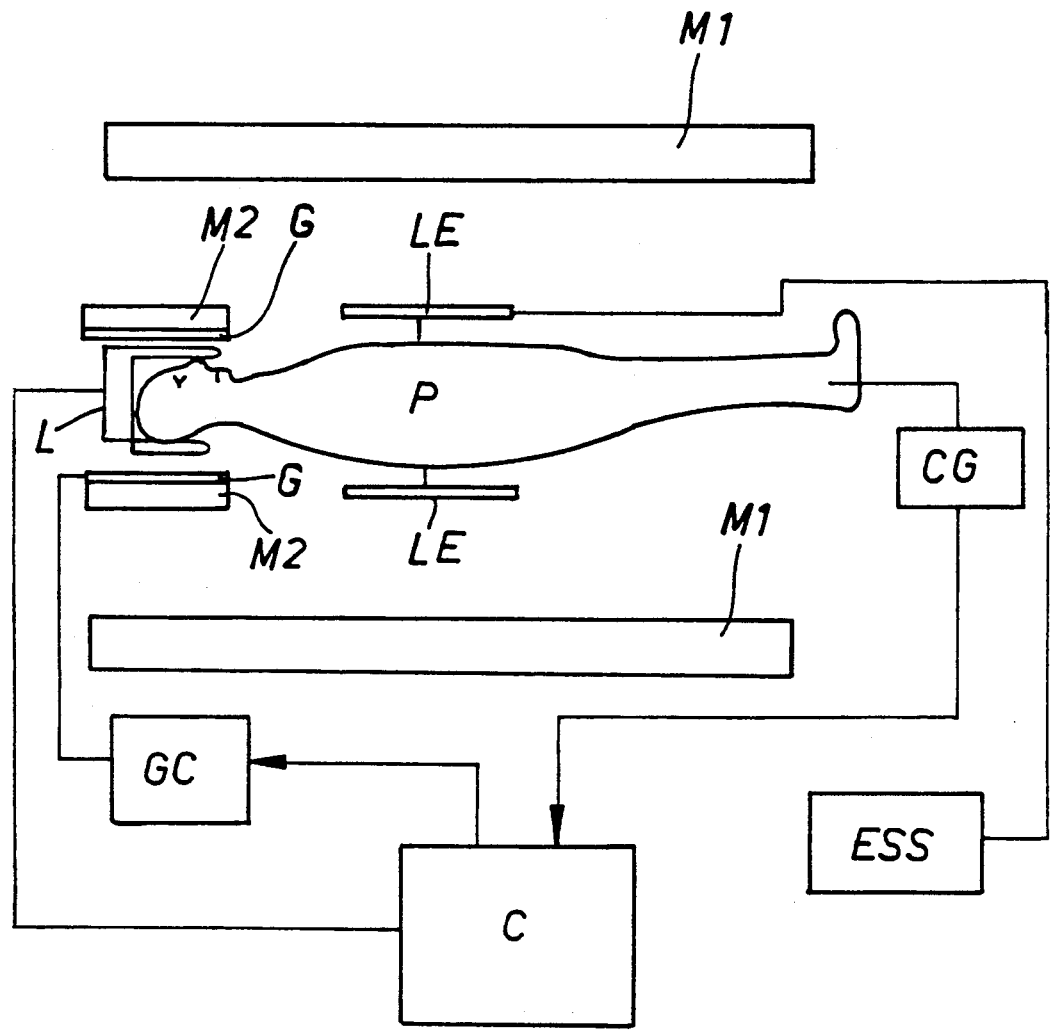
FIG. 3 shows an apparatus of the invention intended for the examination of cerebral blood circulation and perfusion.

FIG. 3 illustrates an apparatus of the invention intended for the examination of cerebral circulation and perfusion. A patient P is placed in the apparatus in a manner that the patient's head is positioned in a polarizing magnetic field Bo2 produced by a magnet M2 and an NMR coil array L is around the head, the magnetic field gradients required in the imaging area are produced by a gradient coil array G, the necessary current being supplied thereto by a gradient current source GC controlled by a computer C. A coil array LE is operated by oscillator and power amplifier unit S for saturating the electron spin system of the blood patient's P pulmonary/cardiac circulation for producing a DNP phenomenon. When circulating in the pulmonary circulation the nuclear magnetization of blood reaches, through the action of DNP, a multiple (factor up to 100) nuclear magnetization as compared to the equilibrium magnetization corresponding to Bo1. Within the imaging area, inside magnet M2, magnetic resonance imaging operations are carried out continuously. The magnetic resonance imaging operations should be synchronized with the action of patient P heart and, therefore, patient P is equipped with a synchronizing assembly CG which identifies the peak of an EKG signal R and which initiates the imaging operations by means of computer C. Other synchronizing possibilities are also conceivable. As an example of those is the blood stream in patient's P carotid arteries which is found out e.g. by means of ultra-sound with the help of Doppler effect caused by the flow. Since the cerebral perfusion imaging employs high gradient strengths and the object is limited, a magnet required for the generation of Bo2 and its stray field can be designed to be small so as not to produce significant inhomogeneity within the area of Bo1.

The same principle can be applied for the examination of blood stream in arteries of the limbs. For example, when examining the blood stream in arteries of the legs, Bo1 is effective within the area of thorax and abdomen and a magnet required for the generation of Bo2 surrounds the leg at the region being examined.

The above specification only deals with one embodiment of the invention.

I claim:

1. A method for carrying out an NMR examination of a component moving from a first location to a second location which is displaced from said first location, said component which is displaced from said first location, said component having an electron spin system capable of resonance in a polarizing magnetic field and a nuclear spin system capable of resonance in a polarizing magnetic field, said first and second locations having magnetic field generating means located thereat, said method comprising the steps of:

applying a first, generally uniform, polarizing magnetic field of a first strength generated by the magnetic field generating means at the first location to the component at the first location;

supplying electromagnetic energy of an electron spin resonance frequency to the component at the first location to saturate the electron spin system and obtain a nuclear magnetization of the nuclear spin system of the component which is enhanced by dynamic nuclear polarization resulting from the saturation of the electron spin system;

applying a second, generally uniform, polarizing magnetic field of a second strength, different from said first field strength, and generated at least in part by the magnetic field generating means at the second location, to the component at the second location; and carrying out an NMR signal data obtaining procedure at the second location for obtaining NMR signal data from the component.

2. A method as set forth in claim 1 wherein the strength of the first magnetic field is less than the strength of the second magnetic field.

3. A method as set forth in claim 1 further including a step of supplying a relaxant to the component, at least prior to the step of supplying the electron spin resonance frequency energy to the component.

4. A method as set forth in claim 1 wherein the movement of the component is periodic in nature and wherein the carrying out of the NMR signal data obtaining procedure is coordinated with the periodic movement of the component.

5. A method as set forth in claim 4 wherein the component is blood moving within a body wherein the method is further defined as one for carrying out an NMR examination the blood within the body and wherein the carrying out of the NMR signal data obtaining procedure is coordinated with the action of the heart.

6. A method as set forth in claim 1 wherein the component moves within an object and wherein said method is further defined a one for carrying out an NMR examination of the component moving within the object.

7. A method as set forth in claim 6 wherein the component is a fluid moving within an organism and wherein the method is further defined as one for carrying out an NMR examination of the fluid moving within the organism.

8. Apparatus for carrying out an NMR examination of a component moving from a first location to a second location which is displaced from said first location, said component having an electron spin system capable of resonance in a polarizing magnetic field and a nuclear spin system capable of resonance in a polarizing magnetic field, said apparatus comprising:

first magnetic field generating means for applying a first, generally uniform, polarizing magnetic field of a first strength to the component at the first location;

means for supplying electromagnetic energy of an electron spin resonance frequency to the component at the first location to saturate the electron spin system and obtain a nuclear magnetization of the nuclear spin system of the component which is enhanced by dynamic nuclear polarization resulting from the saturation of the electron spin system;

second magnetic field generating means for applying, at least in part, a second, generally uniform, polarizing magnetic field of a second strength, different from said first field strength, to the component at the second location; and means for obtaining NMR signal data from the component at the second location.

9. An apparatus as set forth in claim 8 wherein the strength of the first magnetic field is less than the strength of the second magnetic field.

10. An apparatus as set forth in claim 8 wherein the movement of the component is periodic in nature and wherein the apparatus further includes means for coordinating the obtaining of NMR signal data with the periodic movement of the component.

11. An apparatus as set forth in claim 10 wherein the component is blood, wherein the apparatus is further defined as one for carrying out an NMR examination of the blood within a body, and wherein said coordinating means is further defined as coordinating the obtaining of NMR signal data with the action of the heart within the body.

12. An apparatus as set forth in claim 8 wherein the component moves within an object and wherein the apparatus is further defined as one for carrying out an NMR examination of the component moving within the object.

13. An apparatus as set forth in claim 12 wherein the component is a fluid moving within an organism and wherein the apparatus is further defined as one for carrying out an NMR examination of the fluid moving within the organism.

* * * * *